United States Patent
Kim et al.

(10) Patent No.: US 8,667,434 B1
(45) Date of Patent: Mar. 4, 2014

(54) SYSTEM, METHOD, AND COMPUTER PROGRAM PRODUCT FOR ALTERING A HARDWARE DESCRIPTION BASED ON AN INSTRUCTION FILE

(75) Inventors: Victor Kim, San Jose, CA (US); Niloy Das, Noida, CA (US); Raghvendra K. Singh, Noida, CA (US)

(73) Assignee: Calypto Design Systems, Inc., San Jose, CA (US)

( * ) Notice: Subject to any disclaimer, the term of this patent is extended or adjusted under 35 U.S.C. 154(b) by 777 days.

(21) Appl. No.: 12/478,658

(22) Filed: Jun. 4, 2009

(51) Int. Cl.
*G06F 17/50* (2006.01)

(52) U.S. Cl.
USPC ........... 716/102; 716/100; 716/103; 716/104; 716/106; 716/133

(58) Field of Classification Search
USPC ......... 716/100, 103, 104, 106, 109, 111, 133; 703/14
See application file for complete search history.

(56) References Cited

U.S. PATENT DOCUMENTS

| | | | |
|---|---|---|---|
| 7,062,427 B2* | 6/2006 | Walther et al. | 703/22 |
| 2003/0033595 A1* | 2/2003 | Takagi et al. | 717/143 |
| 2004/0225978 A1* | 11/2004 | Fan et al. | 716/6 |
| 2005/0010880 A1* | 1/2005 | Schubert et al. | 716/4 |
| 2006/0156260 A1* | 7/2006 | Ciesielski et al. | 716/3 |
| 2007/0083839 A1* | 4/2007 | Lahner et al. | 716/11 |

* cited by examiner

*Primary Examiner* — Nha Nguyen
(74) *Attorney, Agent, or Firm* — Klarquist Sparkman, LLP

(57) ABSTRACT

A system, method and computer program product are provided for altering a hardware description based on an instruction file. In use, a hardware description is identified. Additionally, the hardware description is analyzed. Further, an instruction file is created based on the analysis. Moreover, the hardware is altered based on the instruction file.

27 Claims, 3 Drawing Sheets

SYSTEM, METHOD, AND COMPUTER PROGRAM PRODUCT FOR ALTERING A HARDWARE DESCRIPTION BASED ON AN INSTRUCTION FILE

FIELD OF THE INVENTION

The present invention relates to hardware descriptions, and more particularly to altering hardware descriptions.

BACKGROUND

Hardware descriptions have traditionally proven useful in the creation of circuits and other electronic hardware. For example, files created utilizing hardware description languages have oftentimes been used for designing and testing electronic hardware. However, traditional techniques for altering hardware descriptions have generally exhibited various limitations.

For example, traditional hardware alteration techniques result in extensively transformed hardware descriptions and supporting files, in which original hardware description logic is difficult, if not impossible, to decipher. Additionally, traditional hardware alteration techniques simultaneously analyze and modify hardware descriptions, making reuse of the modifications difficult. There is thus a need for addressing these and/or other issues associated with the prior art.

SUMMARY

A system, method and computer program product are provided for altering a hardware description based on an instruction file. In use, a hardware description is identified. Additionally, the hardware description is analyzed. Further, an instruction file is created based on the analysis. Moreover, the hardware is altered based on the instruction file.

DETAILED DESCRIPTION

Figure 1:
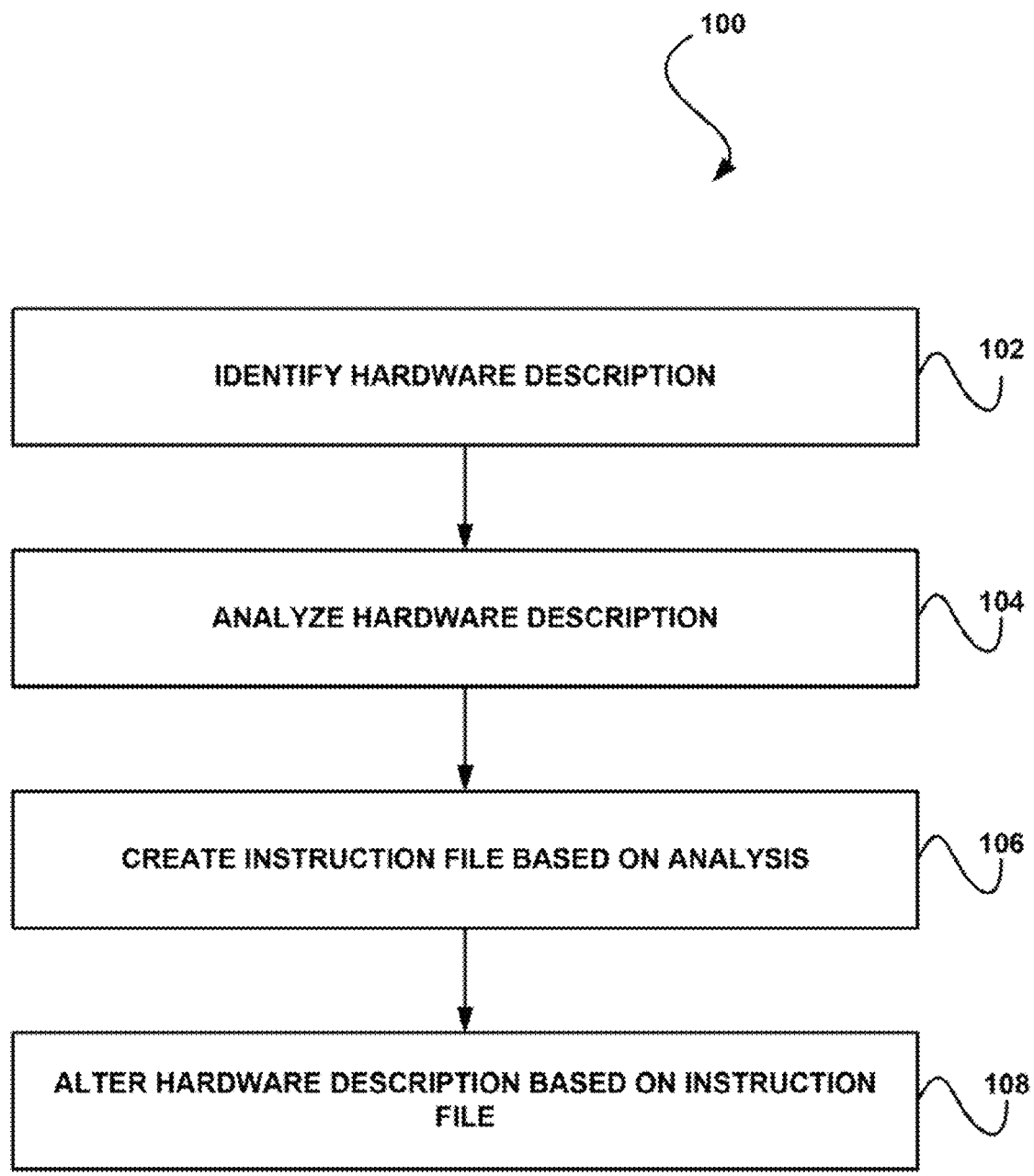
FIG. 1 shows a method for altering a hardware description based on an instruction file, in accordance with one embodiment.

FIG. 1 shows a method 100 for altering a hardware description based on an instruction file, in accordance with one embodiment. As shown in operation 102, a hardware description is identified. In the context of the present description, the hardware description may include any description of hardware (e.g. circuits, etc.). For example, the hardware description may describe a structure, behavior, etc. of the hardware.

In one embodiment, the hardware description may include text. For example, the hardware description may include a register transfer level (RTL) description. In another example, the hardware description may include one or more hardware description language (HDL) expressions, such as one or more expressions written in Verilog, one or more expressions written in Very High Speed Integrated Circuits hardware description language (VHDL), etc.

As also shown, the hardware description is analyzed. Note operation 104. In one embodiment, the analyzing may include parsing the hardware description. For example, the hardware description may be checked for syntax errors. In another embodiment, the analyzing may include determining a context of the hardware description. For example, the analyzing may include determining a control and data flow context of the hardware description. In another example, an intent of a drafter of the hardware description may be inferred by reasoning through one or more dataflow equations of the hardware description. In yet another embodiment, the analyzing may include creating a netlist graph of the hardware description. For example, the hardware description may be converted into a netlist graph.

Additionally, the analyzing may include determining an optimization of the hardware description. For example, the analyzing may include determining improvements that can be made within the hardware description. In another example, an optimized netlist graph may be created based on the converted hardware description noted above. In one embodiment, new signal connectivity and/or control flow logic that optimizes the hardware description may be determined.

Further still, the analyzing may include creating an optimized hardware description. For example, the optimized netlist graph may be converted into the new hardware description using reverse abstraction. In one embodiment, the analyzing may be performed automatically. For example, the analyzing may be performed by a tool. In another embodiment, the optimized hardware description may contain a minimum amount of alterations when compared to the original hardware description. In yet another embodiment, the optimized hardware description may include one or more sequential logic expressions that modify the original hardware description.

Still yet, as shown in operation 106, an instruction file is created based on the analysis. In the context of the present description, the instruction file may include any instructions for performing one or more alterations to the hardware description. For example, the instruction file may indicate a location in the hardware description, such as a line number, paragraph number, page number, etc. In one embodiment, the location may include a location where a change is to be made to the hardware description.

Additionally, in another embodiment, the instruction file may indicate an action to be performed on the hardware description (e.g. at the indicated location), such as an addition of text, a subtraction of text, a copying of text, a changing of text, etc. For example, the instruction file may include one or more expressions, such as sequential logic expressions, to be inserted into the hardware description in order to alter the data flow of the hardware description. Additionally, these expressions may closely follow expressions found in the hardware description. For example, the expressions may be modeled after or more expressions included in the hardware description.

In this way, the instruction file may include one or more incremental changes to be made to the hardware description. In another embodiment, the expressions may optimize the hardware description. For example, the expressions may perform power savings within the hardware description. In yet another embodiment, the instruction file may include instructions for manipulating strings via regular expressions.

Further, the instruction file may be separate from the hardware description. For example, the instruction file may be distinct from a hardware description file including the hardware description. Additionally, in one embodiment, the instruction file may incorporate optimizations of the hardware description determined during the analyzing. In another embodiment, the instruction file may be created as a result of a comparison between the original hardware description and the optimized hardware description. In this way, the instruction file may capture only the differences contributed as a result of the analyzing.

Furthermore, the hardware description is altered based on the instruction file. See operation 108. The altering may include changing any aspect of the hardware description. For example, the altering may include optimizing the data flow of the hardware description. In one embodiment, the altering may include adding to the hardware description, removing a portion of the hardware description, and/or replacing a portion of the hardware description. For example, the altering may include incorporating a sequential logic expression into the hardware description. In another example, the altering may include changing the structure of the hardware description. In still another example, the altering may include modifying the control flow of the hardware description. Additionally, the altering may occur at the HDL level. In yet another embodiment, the altering may be performed in such a manner as to minimize changes to the hardware description.

In another embodiment, the altering of the hardware description may be performed in-place. For example, the hardware description may be modified in-place. In another example, existing sequential behavior and/or structure within the hardware description may be left intact during the altering. In another embodiment, textual edits that closely follow an aspect of the original hardware description may be surgically inserted into the original hardware description. For example, the aspect may include a type of code used in the hardware description, a style of code used in the hardware description, a structural layout of the hardware description, or any other element of the hardware description. In this way, the sequential behavior of both RTL and structural representations of the hardware description may be optimized.

In another example, register assignments in the hardware description may be negated by recycling previous register values when new values are unnecessary. In yet another example, register slices within the hardware description may be modified individually even if the original register was not expressed in terms of the slices. In still another example, new enable conditions may be composited onto existing enable-pins of user-defined interfaces around sequential cell instances in the hardware description.

In another embodiment, instructions in the instruction file may be executed in order to alter the hardware description. In still another embodiment, the altered hardware description may be saved as a new file separate from the original hardware description, and the original hardware description may remain unchanged. In another embodiment, the altering may be performed separately from the analyzing. In this way, the altering of the hardware description may be decoupled from the analysis of the hardware description.

Additionally, the altering can be time-shifted, and therefore need not necessarily be performed immediately after the analysis of the hardware description and the creation of the instruction file, as an option. Further, alteration based on the instruction file may be repeated without necessarily having to perform the analysis again. Further still, in another embodiment, additional hardware descriptions may be altered based on the instruction file. For example, new versions of the original hardware description may be altered based on the instruction file. As such, the additional hardware descriptions may be altered without first performing an analysis.

In this way, unnecessary complexity in the hardware description may be simplified using the instruction file. For example, redundancies in the hardware description may be eliminated. In yet another embodiment, power-reduction logic may be formulated that increases power savings in the hardware description. For example, flip-flops described in the hardware description may be selectively put to sleep based on surrounding logic conditions. In another example, assignments within the hardware description may be altered in order to control the use of power within the hardware description. For instance, memory access and signal path design may be altered.

At the same time, the textual content of the original hardware description may remain at least mostly, if not totally, intact. For example, the style of coding (e.g., in Verilog, VHDL, etc.) as well as the names of registers, hierarchical components, signals, and variables may be preserved within the hardware description. In another example, the placement of declarations and definitions as well as control-flow statements and logical expressions may be preserved, as well as comments, compiler directives, indentation, and whitespaces.

Further, the functional intent of the original hardware description may be at least mostly, if not totally, preserved. For example, the original design intent and output behavior of the hardware description may remain intact, as well as the synchronous and asynchronous reset behavior, hierarchical boundaries, and composition relationships of the hardware description. Further still, the physical organization of the original hardware description may be at least mostly, if not totally, preserved. For example, the file names associated with the original hardware description, as well as the file layout across one or more directories, and the input as set up for RTL tools such as synthesis tools, etc. may be maintained.

Additionally, general complications related to traditional alteration of hardware descriptions may be overcome. For example, line-overlap between statements may be avoided by breaking up statements in the same hardware description line and rearranging the text of the statements while maintaining the general structure of the hardware description. Table 1 illustrates one exemplary instance of a hardware description statement where line overlap is addressed. It should be noted that the hardware description statement presented in Table 1 is set forth for illustrative purposes only, and thus should not be construed as limiting in any manner.

TABLE 1

| ff1 <=new_value1; ff2 <=new_value2; |
|---|

As shown in Table 2, two techniques are employed in order to modify the statement in Table 1 such that new code is inserted only around the "ff1" portion of the statement. It should be noted that the statement modification presented in Table 2 is set forth for illustrative purposes only, and thus should not be construed as limiting in any manner.

TABLE 2

| //Splice the new code into the middle of the "sentence"<br>if (ff1_en) begin ff1 <= new_value1; end; ff2 <= new_value2;<br>//Comment out the entire line and re-write it from scratch<br>//ff1 <= new_value1; ff2 <=new_value2;<br>if (ff1_en) begin<br>   ff1 <= new_value 1;<br>end<br>ff2 <= new_value2; |
|---|

In another example, placement possibilities of comments and pragmas, the generation of templates for conditional and loop expansion, and blocking and unblocking of assignment semantics may all be addressed.

Additionally, complications relating to the use of a particular HDI, may be overcome. For example, with respect to Verilog, preprocessing macros, signal compatibility between signed and unsigned information, and syntactical limitations on block-scope registers may all be addressed. In another example, with respect to VHDL, design libraries as well as multiple architectures and configuration possibilities may all be addressed. Additionally, signal compatibility between native data types, Institute of Electrical and Electronics Engineers (IEEE) types, and user types may be addressed. For example, Table 3 illustrates a custom data type defined by a user. Again, it should be noted that the custom data type presented in Table 3 is set forth for illustrative purposes only, and thus should not be construed as limiting in any manner.

TABLE 3

TYPE color IS ( red, blue, yellow, green );

In order to address the above data type, a numeric representation may be introduced for the custom data type so that it can be treated like a binary signal rather than an abstract value. For example, Table 4 illustrates an exemplary type-conversion function. Again, it should be noted that the type-conversion function presented in Table 4 is set forth for illustrative purposes only, and thus should not be construed as limiting in any manner.

TABLE 4

FUNCTION to_bitvector(arg : color) RETURN STD_LOGIC_VECTOR IS
BEGIN
   CASE arg IS
      WHEN red => RETURN "00";
      WHEN blue => RETURN "01";
      WHEN yellow => RETURN "10";
      WHEN green => RETURN "11";

Further, syntactical limitations on output declared signals and block-scope variables may be addressed. For example, Table 5 illustrates an example of VHDL text including a write-only signal. Yet again, it should be noted that the VHDL text presented in Table 5 is set forth for illustrative purposes only, and thus should not be construed as limiting in any manner.

TABLE 5

ENTITY sub1 PORT ( q : OUT STD_LOGIC );

As shown in Table 5, signal "q" is not able to be read because the original hardware description has forced it to be a write-only signal. However, as shown in Table 6, a feed-through connection may be introduced using a new input port that enables "q" to be both read and write, without imposing a more drastic re-write of multiple parts of the hardware description. Again, it should be noted that feed-through connection presented in Table 6 is set forth for illustrative purposes only, and thus should not be construed as limiting in any manner.

TABLE 6

ENTITY sub1 PORT ( q : OUT STD_LOGIC; q_in : IN STD_LOGIC );
e_sub1 : sub1 PORT MAP ( q => outer_signal, q => outer_signal );

More illustrative information will now be set forth regarding various optional architectures and features with which the foregoing technique may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
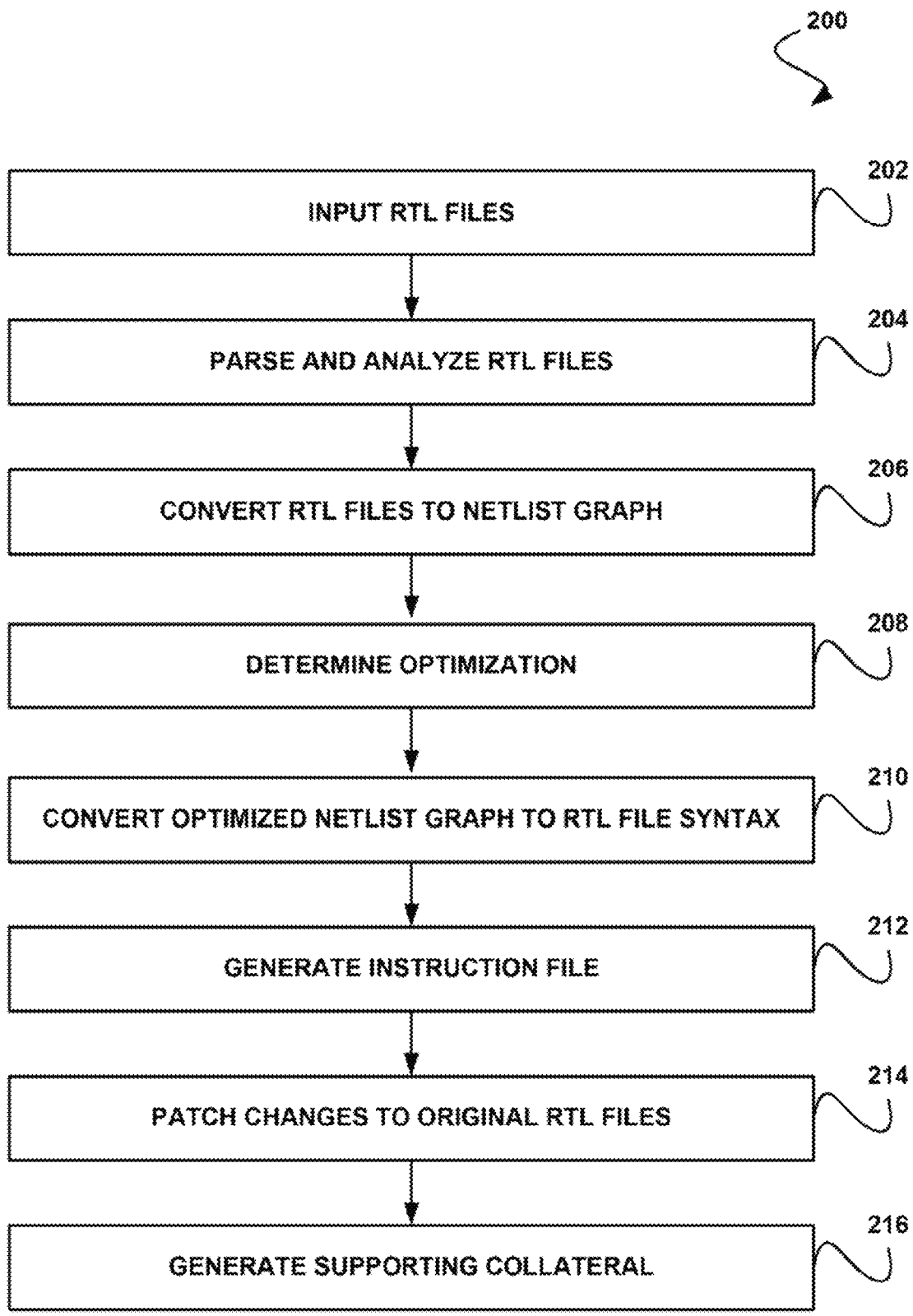
FIG. 2 shows a method for patching changes to a register transfer level (RTL) file, in accordance with another embodiment.

FIG. 2 shows a method 200 for patching changes to a register transfer level (RTL) file, in accordance with another embodiment. As an option, the method 200 may be carried out in the context of the details of FIG. 1. Of course, however, the method 200 may be carried out in any desired environment. Further, the aforementioned definitions may equally apply to the description below.

As shown in operation 202, one or more register transfer level (RTL) files are input. The RTL files may include Verilog files, VHDL files, or any other files written at the register transfer level which includes a hardware description. Additionally, the RTL files are parsed and analyzed, as shown in operation 204. For example, the RTL files may be read and checked for syntax problems. Additionally, user intent about a type of desired hardware logic may be inferred by reasoning through dataflow equations of the RTL files.

Further, as shown in operation 206, the RTL files are converted to a netlist graph. For example, any hardware logic in the RTL files may be internally represented in the form of a graph of computation and storage elements. Further still, an optimization is determined. See operation 208. For example, unnecessary complexity may be determined in the netlist graph and/or the RTL files and may be simplified. In another example, redundancies in the netlist graph and/or RTL files may be determined and eliminated. In this way, a core essence of the control logic of the netlist graph and/or RTL files may be determined. Further, in another example, new power-reduction logic may be formulated and added to the complete hardware design specified in the netlist graph and/or RTL files.

Also, as shown in operation 210, the optimized netlist graph is converted to RTL file syntax. In one embodiment, the netlist graph may be converted to a RTL file using reverse abstraction. For example, any new logic elements and information routing across the design of the optimized netlist graph may be isolated and compared against the original netlist graph, and the graph representation of these new items may then be translated into a matching optimized RTL file syntax.

Additionally, an instruction file for patching details is generated. See operation 212. In one embodiment, the portions of the optimized RTL files that are different from the original RTL files may be determined. These portions may then be extracted into an instruction file. For example, the instruction file may include multiple segments, each of which consists of a description of an action to take (e.g., add, subtract, change, copy, paste, etc.), and an RTL text paragraph (e.g., a fragment of what the patched RTL files should look like).

Furthermore, in operation 214, the changes illustrated in the instruction file are patched to the original RTL files. For example, the patching may include following the described actions to be taken within each segment of the instruction file, and performing the actions on the original RTL files. In one embodiment, new modified RTL files may be produced for each original RTL file, and the original RTL files may remain unaltered. In another embodiment, a modified RTL file may not necessarily be produced for a particular RTL file if the instruction file does not describe any actions to be taken for that RTL file.

Further still, supporting collateral is generated, as shown in operation 216. In one embodiment, the supporting collateral may include additional files produced to enhance the usability of the modified RTL files. For example, a unified inventory list of files may be generated which integrates the original RTL files and the modified RTL files together into a coherent whole. In another example, the inventory list may guide a subsequent design process for an additional automation tool. In yet another embodiment, a verification setup may be generated in order to confirm that no functional mismatches were introduced by the changes made to the original RTL files during the patching process.

Table 7 shows one exemplary RTL file before analysis and alteration. While Verilog hardware description language (HDL) is used for providing descriptions of at least some of the transformations in Tables 7-12, it should be noted that such language is utilized for exemplary purposes only, and thus should not be construed as limiting in any manner. Additionally, it should be noted that RTL file is set forth in Tables 7-12 for illustrative purposes only, and thus should not be construed as limiting in any manner.

TABLE 7

| | |
|---|---|
| 1 | module top( |
| 2 | input clk, wen, d1 , d2, |
| 3 | output q_out |
| 4 | ); |
| 5 | reg which_flop; |
| 6 | always @(posedge clk) // 1-cycle delay (flop) onto input |
| 7 | which_flop <= wen; |
| 8 | |
| 9 | // two flops here by assignment |
| 10 | reg q1, q2; |
| 11 | always @(posedge clk) begin |
| 12 | q1 <= d1 ; |
| 13 | q2 <= d2; |
| 14 | end |
| 15 | |
| 16 | // This assignment determines which of the 2 flop values is actually used |
| 17 | assign q_out = which_flop ? q1 : q2; |
| 18 | endmodule |

As shown in Table 7, registers q1 and q2 are intended to be flip-flops. In one embodiment, an automated analysis of the RTL file may determine that only one of the two registers needs to load a new value during a particular clock cycle.

Table 8 shows the RTL file in Table 7 after it has been parsed, analyzed, converted into a netlist graph, optimized, and converted back to Verilog RTL file syntax. Again, it should be noted that such file is set forth for illustrative purposes only, and thus should not be construed as limiting in any manner.

TABLE 8

| | |
|---|---|
| 1 | module top( |
| 2 | input clk, wen, d1, d2, |
| 3 | output q_out |
| 4 | ); |
| 5 | wire                q1_en; // new signal |
| 6 | wire                q2_en; // new signal |
| 7 | reg which_flop; |
| 8 | always @(posedge clk) // 1-cycle delay (flop) onto input |
| 9 | which_flop <= wen; |
| 10 | |
| 11 | // two flops here by assignment |
| 12 | reg q1, q2; |
| 13 | |
| 14 | // new logic instance |
| 15 | cg_obs_top inst_cg_obs_top( .q1_en( q1_en ), |
| 16 |         .q2_en( q2_en ), |

TABLE 8-continued

| | |
|---|---|
| 17 |         .wen( wen )); |
| 18 | |
| 19 | always @(posedge clk) begin |
| 20 | if ( q1_en ) // new control flow |
| 21 | q1 <= d1; |
| 22 | if( q2_en ) // new control flow |
| 23 | q2 <= d2; |
| 24 | end |
| 25 | |
| 26 | // This assignment determines which of the 2 flop values is actually used |
| 27 | assign q_out = which_flop ? q1 : q2;   . |
| 28 | endmodule |
| 29 | |
| 30 | |
| 31 | module cg_obs_top ( q1_en , q2_en , wen ) ; // new logic hierarchy |
| 32 | input wen ; // (wen) orig_1.v:2 |
| 33 | output q1_en = wen; |
| 34 | output q2_en = !wen; |
| 35 | endmodule |

As shown in Table 8, power saving logic expressions are input in lines 5-6, 14-17, 20, 22, and 31-34. In this way, the logic may be distributed and optimally localized to each region of flip-flops and memory elements, while the original logic remains undisturbed. Additionally, the added logic expressions may be sequential in nature and may modify the control flow of the original RTL file, as shown in lines 20 and 22 of Table 8. In this way, the register assignments of the optimized RTL file (e.g., in lines 21 and 23 of Table 8) may be guarded by new conditional control flow statements (e.g., in lines 20 and 22 of Table 8). Further, in one embodiment, the added logic expressions may be encapsulated into its own hierarchy. For example, see the added power saving logic expressions at line 31 of Table 8.

Table 9 shows an exemplary instruction file resulting from a comparison between the optimized RTL file in Table 8 and the original RTL file in Table 7. It should be noted that such instruction file is set forth for illustrative purposes only, and thus should not be construed as limiting in any manner.

TABLE 9

| | |
|---|---|
| 1 | Index: /home/user/rtl/orig_1.v |
| 2 | after 3 until ';' |
| 3 | > wire                q1_en; // new signal |
| 4 | > wire                q2_en; // new signal |
| 5 | before 11 for cginst inst_cg_obs_top |
| 6 | > // new logic instance |
| 7 | > cg_obs_top inst_cg_obs_top( .q1_en( q1_en ), |
| 8 | >        .q2_en( q2_en ), |
| 9 | >        .wen( wen )); |
| 10 | before 12 |
| 11 | >      if ( q1_en ) // new control flow |
| 12 | before 13 |
| 13 | >      if ( q2_en ) // new control flow |

As shown in Table 9, line 1 directs to the original RTL file that is to be patched. In this way, the instruction file may enable location tracking through filenames, line numbers, column numbers, etc. Additionally, lines 2-13 of Table 9 detail the optimizations performed by the instruction file. For example, the phrase "before 12" at line 10 of Table 9 signifies that "before line number 12 of the original RTL file, insert the following new text." In another example, the phrase "after 3 until ';'" at line 2 of Table 9 signifies that "after line 3 of the original RTL file, or as far as the next closing semicolon of the original RTL file, insert the following new text." In this way, incremental portions of new logic may be inserted into the original RTL file.

Table 10 shows another exemplary RTL file before analysis and alteration, where the RTL file contains more hierarchical modules than in Table 7. It should be noted that RTL file is set forth for illustrative purposes only, and thus should not be construed as limiting in any manner

TABLE 10

| | |
|---|---|
| 1 | module top( |
| 2 | input clk, w_a, w_b, d1, d2, |
| 3 | output q_out |
| 4 | ); |
| 5 | wire which_flop; |
| 6 | selector ss (clk, w_a, w_b, which_flop); |
| 7 | |
| 8 | wire q1, q2; |
| 9 | flip_flop ff1 (clk, d1, q1); |
| 10 | flip_flop ff2 (clk, d2, q2); |
| 11 | |
| 12 | // This assignment determines which of the 2 flop values is actually used |
| 13 | assign q_out = which_flop ? q1 : q2; |
| 14 | endmodule |
| 15 | |
| 16 | |
| 17 | module selector( |
| 18 | input clk, sel1, sel2, |
| 19 | output reg sel_out |
| 20 | ); |
| 21 | wire sel_comb = sel1 & sel2; |
| 22 | always @(posedge clk) |
| 23 | sel_out <= sel_comb; |
| 24 | endmodule |
| 25 | |
| 26 | |
| 27 | module flip_flop( // A common flip-flop model |
| 28 | input clk, d, |
| 29 | output reg q |
| 30 | ); |
| 31 | always @(posedge clk) |
| 32 | q <= d; |
| 33 | endmodule |

Table 11 shows the RTL file in Table 10 after it has been parsed, analyzed, converted into a netlist graph, optimized, and converted back to Verilog RTL file syntax. Again, it should be noted that such file is set forth for illustrative purposes only, and thus should not be construed as limiting in any manner.

TABLE 11

| | |
|---|---|
| 1 | module top( |
| 2 | input clk, w_a, w_b, d1, d2, |
| 3 | output q_out |
| 4 | ); |
| 5 | wire sel_comb; // new signal |
| 6 | wire which_flop; |
| 7 | selector ss (clk, w_a, w_b, which_flop, sel_comb ); |
| 8 | |
| 9 | wire q1, q2; |
| 10 | flip_flop ff1 (clk, d1, q1 , sel_comb ); |
| 11 | flip_flop_PP_0 ff2 (clk, d2, q2, sel_comb ); |
| 12 | |
| 13 | // This assignment determines which of the 2 flop values is actually used |
| 14 | assign q_out = which_flop ? q1 : q2; |
| 15 | endmodule |
| 16 | |
| 17 | |
| 18 | module selector( |
| 19 | input clk, sel1, sel2, |
| 20 | output reg sel_out |
| 21 | , output sel_comb_1 ); |
| 22 | wire sel_comb = sel1 & sel2; |
| 23 | |
| 24 | // new port and signal |
| 25 | assign sel_comb_1 = sel_comb; |

TABLE 11-continued

| | |
|---|---|
| 26 | |
| 27 | always @(posedge clk) |
| 28 | sel_out <= sel_comb; |
| 29 | endmodule |
| 30 | |
| 31 | |
| 32 | module flip_flop_PP_0( // A common flip-flop model |
| 33 | input clk, d, |
| 34 | output reg q |
| 35 | , input sel_comb ); |
| 36 | |
| 37 | wire q_en; // new signal |
| 38 | // new logic instance |
| 39 | cg_obs_flip_flop_0 inst_cg_obs_flip_flop_0( .q_en( q_en ), |
| 40 | .sel_comb( sel_comb )); |
| 41 | |
| 42 | always @(posedge clk) |
| 43 | begin |
| 44 | if ( q_en ) // new control flow |
| 45 | q <= d; |
| 46 | end |
| 47 | endmodule |
| 48 | |
| 49 | |
| 50 | module flip_flop( // A common flip-flop model |
| 51 | input clk, d, |
| 52 | output reg q |
| 53 | , input sel_comb ); |
| 54 | |
| 55 | wire q_en; // new signal |
| 56 | // new logic instance |
| 57 | cg_obs_flip_flop inst_cg_obs_flip_flop( .q_en( q_en ), |
| 58 | .sel_comb( sel_comb )); |
| 59 | |
| 60 | always @(posedge clk) |
| 61 | begin |
| 62 | if( q_en ) // new control flow |
| 63 | q <= d; |
| 64 | end |
| 65 | endmodule |
| 66 | |
| 67 | |
| 68 | module cg_obs_flip_flop ( q_en , sel_comb ) ; |
| | // new logic hierarchy |
| 69 | input sel_comb ; // (ss.sel_comb) orig_2.v:21 |
| 70 | output q_en = sel_comb; |
| 71 | endmodule |
| 72 | |
| 73 | |
| 74 | module cg_obs_flip_flop_0 ( q_en , sel_comb ) ; |
| | // new logic hierarchy |
| 75 | input sel_comb ; // (ss.sel_comb) orig_2.v:21 |
| 76 | output q_en = !sel_comb; |
| 77 | endmodule |

As shown in at least lines 9, 12, 13, and 23 of Table 11, input signals required by added logic may be propagated across hierarchical boundaries through the addition of new connections. In one embodiment, the input signals may be propagated through the addition of new ports. In another embodiment, output signals generated by the added logic may be routed across hierarchical boundaries through new ports and/or signals. Further, as shown in Table 11, each unique instance of a multiply instantiated hierarchy is first cloned into an isolated context and then modified uniquely. For example, see at least lines 34, 41, and 58 of Table 11. In this way, signals not locally present in the original hardware description may be propagated across boundaries, and unique contextual opportunities for reused RTL templates may be customized for optimal power savings. Further still, lines 69 and 74 of Table 11 denote added power-saving logic for the flip-flops in the original RTL file.

Table 12 shows an exemplary instruction file resulting from a comparison between the optimized RTL file in Table 11 and the original RTL file in Table 10. It should be noted that such instruction file is set forth for illustrative purposes only, and thus should not be construed as limiting in any manner.

TABLE 12

```
 1  Index: /home/user/rtl/orig_2.v
 2  after 3 until ';'
 3  > wire              sel_comb; // new signal
 4  edit 6 until ';'
 5  > s'\)\s*\;', sel_comb );'s
 6  edit 9 until ';'
 7  > s'\)\s*\;', sel_comb );'s
 8  edit 10-10 until ';' for rename flip_flop to flip_flop_PP_0 for ff2
 9  > s'flip_flop'flip_flop_PP_0'
10  > s'\)\s*\;', sel_comb );'s
11  edit 19 until ';'
12  > s'\)\.s*\;', output  sel_comb_1 );'s
13  after 21 until ';'
14  > // new port and signal
15  > assign sel_comb_1 = sel_comb;
16  replicate 27-32 until 'endmodule' for flip_flop_0
17  > s|//(.*?)flip_flop|//$ {1}flip_flop_0|g or 1
18  edit 27-28 for replicate flip_flop to flip_flop_PP_0 for ff2
19  > s'flip_flop'flip_flop_PP_0'
20  edit 29 until ';'
21  > s'\)\s*\;', input   sel_comb );'s
22  after 29 until ';'
23  > wire              q_en; // new signal
24  before 31 for cginst ff2.inst_cg_obs_flip_flop_0
25  > // new logic instance
26  > cg_obs_flip_flop_0 inst_cg_obs_flip_flop_0( .q_en( q_en ),
27  >    .sel_comb( sel_comb ));
28  before 32
29  >   begin
30  >    if ( q_en ) // new control flow
31  after 32 until ';'
32  >   end
33  endreplicate
34  edit 29 until ';'
35  > s'\)\s*\;', input   sel_comb );'s
36  after 29 until ';'
37  > wire              q_en; // new signal
38  before 31 for cginst ff1.inst_cg_obs_flip_flop
39  > // new logic instance
40  > cg_obs_flip_flop inst_cg_obs_flip_flop( .q_en( q_en ),
41  >    .sel_comb( sel_comb ));
42  before 32
43  >   begin
44  >    if ( q_en ) // new control flow
45  after 32 until ';'
46  >   end
```

As shown in Table 12, line 1 directs to the original RTL file that is to be patched. Additionally, line 5 of Table 12 calls for the appending of a new port connection to line 6 of the original RTL fife. Further, lines 16-33 deal with one flip-flop of the original RTL file, and lines 34-46 deal with the other flip flop of the RTL file. Additionally, line 16 performs a copy and paste function for purposes of cloning.

Figure 3:
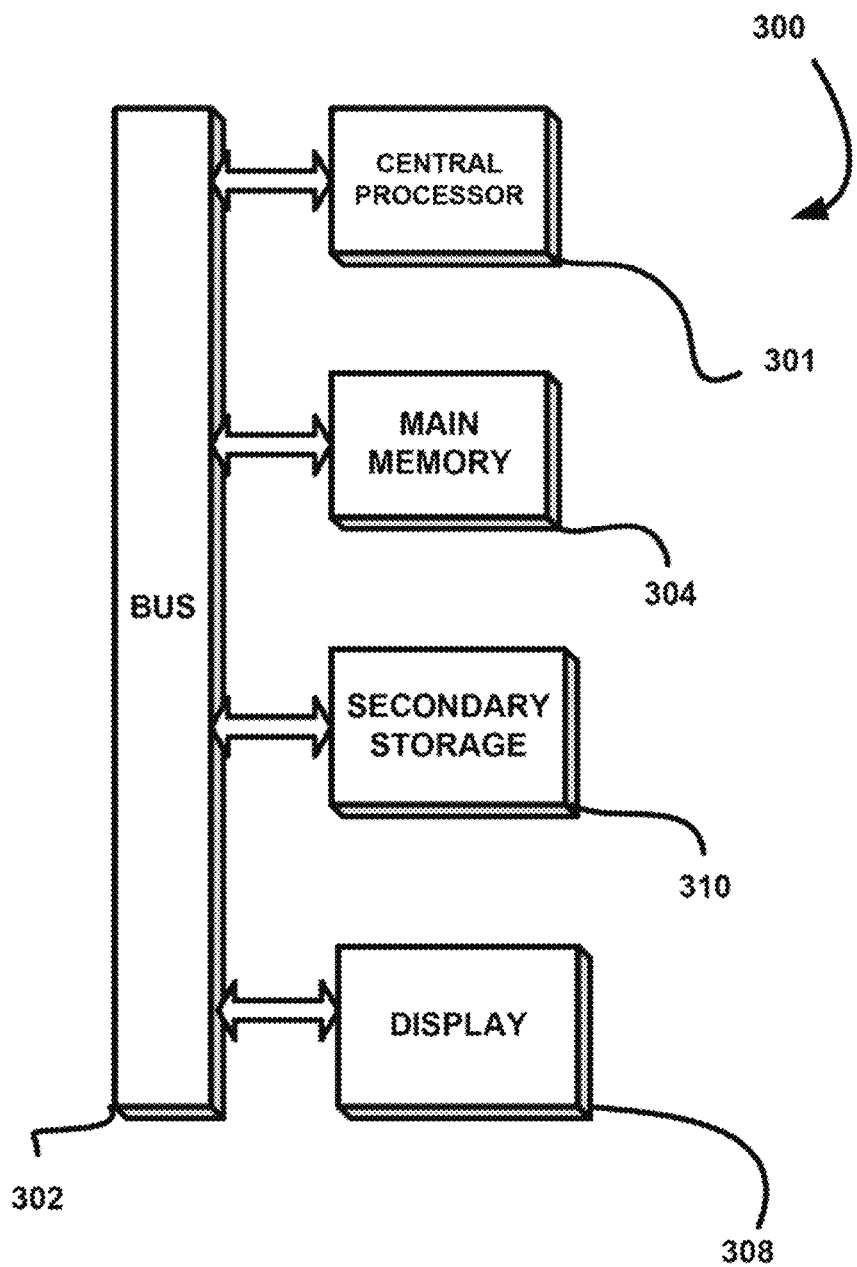
FIG. 3 illustrates an exemplary system, in accordance with one embodiment.

FIG. 3 illustrates an exemplary system 300 with which the various features of FIGS. 1 and/or 2 may be implemented, in accordance with one embodiment. Of course, the system 300 may be implemented in any desired environment.

As shown, a system 300 is provided including at least one central processor 301 which is connected to a communication bus 302. The system 300 also includes main memory 304 [e.g. random access memory (RAM), etc.]. The system 300 also includes a display 308.

The system 300 may also include a secondary storage 310. The secondary storage 310 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 304 and/or the secondary storage 310. Such computer programs, when executed, enable the system 300 to perform various functions. Memory 304, storage 310 and/or any other storage are possible examples of computer-readable media.

In one embodiment, such computer programs may be used to carry out the functionality of the previous figures. Further, in other embodiments, the architecture and/or functionality of the various previous figures may be implemented utilizing the host processor 301, a chipset (i.e. a group of integrated circuits designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer program product embodied on a non-transitory computer readable medium, storing:

computer code for analyzing a hardware description;

computer code for creating an instruction file based on the analysis; and computer code for altering the hardware description based on the instruction file, wherein the instruction file includes instructions for performing one or more alterations to the hardware description, wherein the instruction file is created as a result of a comparison between the hardware description and an optimized hardware description, such that the instruction file captures the differences contributed as a result of the analyzing, and wherein the analyzing includes converting the hardware description into a graph, creating an optimized graph based on the graph, and converting the optimized graph into the optimized hardware description using reverse abstraction.

2. The computer program product of claim 1, wherein the instruction file includes an expression to be inserted into the hardware description.

3. The computer program product of claim 2, wherein the computer program product is operable such that the expression performs power savings within the hardware description.

4. The computer program product of claim 2, wherein the expression is modeled after an expression included in the hardware description.

5. The computer program product of claim 1, wherein the altering includes adding to the hardware description.

6. The computer program product of claim 1, wherein the altering is performed separately from the analyzing.

7. The computer program product of claim 1, wherein the altering is time-shifted.

8. The computer program product of claim 1, wherein the computer program product is operable such that an existing structure within the hardware description is left intact during the altering.

9. The computer program product of claim 1, wherein the instruction file indicates a location in the hardware description.

10. The computer program product of claim 9, wherein the location includes one or more of a path name to the hardware description, line number in the hardware description, a paragraph number in the hardware description, and a page number in the hardware description.

11. The computer program product of claim 1, wherein the altering includes modifying a control flow of the hardware description.

12. The computer program product of claim 1, wherein the instruction file is separate from the hardware description.

13. The computer program product of claim 1, wherein the hardware description includes a Verilog expression.

14. The computer program product of claim 1, wherein the hardware description includes a Very High Speed Integrated Circuits hardware description language (VHDL) expression.

15. The computer program product of claim 1, wherein the analyzing includes determining a control and data flow context of the hardware description.

16. The computer program product of claim 1, wherein the analyzing includes determining an optimization of the hardware description.

17. The computer program product of claim 16, wherein determining the optimization of the hardware description includes determining one or more of new signal connectivity or control flow logic that optimizes the hardware description.

18. The computer program product of claim 1, wherein the analyzing includes inferring an intent of a drafter of the hardware description by reasoning through one or more dataflow equations of the hardware description.

19. The computer program product of claim 1, wherein the altering includes changing a structure of the hardware description.

20. The computer program product of claim 1, wherein the instruction file includes one or more sequential logic expressions to be inserted into the hardware description in order to alter a data flow of the hardware description.

21. A computer-implemented method, comprising:
analyzing a hardware description;
creating an instruction file based on the analysis, utilizing a processor; and
altering the hardware description based on the instruction file,
wherein the instruction file includes instructions for performing one or more alterations to the hardware description,
wherein the instruction file is created as a result of a comparison between the hardware description and an optimized hardware description, such that the instruction file captures the differences contributed as a result of the analyzing, and
wherein the analyzing includes converting the hardware description into a graph, creating an optimized graph based on the graph, and converting the optimized graph into the optimized hardware description using reverse abstraction.

22. The method of claim 21, wherein the altering is time-shifted.

23. The method of claim 21, wherein the instruction file indicates a location in the hardware description.

24. A system, comprising:
a processor for analyzing a hardware description, creating an instruction file based on the analysis, and altering the hardware description based on the instruction file,
wherein the instruction file includes instructions for performing one or more alterations to the hardware description,
wherein the instruction file is created as a result of a comparison between the hardware description and an optimized hardware description, such that the instruction file captures the differences contributed as a result of the analyzing,
wherein the analyzing includes converting the hardware description into a graph, creating an optimized graph based on the graph, and converting the optimized graph into the optimized hardware description using reverse abstraction.

25. The system of claim 24, wherein the processor remains in communication with memory via a bus.

26. The system of claim 24, wherein the altering is time-shifted.

27. The system of claim 24, wherein the instruction file indicates a location in the hardware description.

* * * * *